(12) United States Patent
Malik

(10) Patent No.: US 7,191,425 B1
(45) Date of Patent: Mar. 13, 2007

(54) METHOD AND APPARATUS FOR INSERTING EXTRA TRACKS DURING LIBRARY ARCHITECTURE MIGRATION

(75) Inventor: Shobhit Malik, Santa Clara, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 295 days.

(21) Appl. No.: 10/993,963

(22) Filed: Nov. 18, 2004

(51) Int. Cl.
*G06F 17/50* (2006.01)

(52) U.S. Cl. .............................. 716/14; 706/13; 706/3; 706/2

(58) Field of Classification Search .................. 716/14, 716/13, 3, 2
See application file for complete search history.

(56) References Cited

U.S. PATENT DOCUMENTS

| | | | | |
|---|---|---|---|---|
| 5,404,310 A | * | 4/1995 | Mitsuhashi ................... | 716/13 |
| 5,856,927 A | * | 1/1999 | Greidinger et al. ........... | 716/12 |
| 6,035,111 A | * | 3/2000 | Suzuki et al. ................. | 716/11 |
| 6,128,767 A | * | 10/2000 | Chapman ....................... | 716/1 |
| 6,330,707 B1 | * | 12/2001 | Shinomiya et al. ........... | 716/14 |
| 6,385,758 B1 | * | 5/2002 | Kikuchi et al. ................. | 716/2 |
| 6,505,334 B1 | * | 1/2003 | Tanaka .......................... | 716/13 |
| 6,530,066 B1 | * | 3/2003 | Ito et al. ......................... | 716/5 |
| 6,971,082 B2 | * | 11/2005 | Shiratori ........................ | 716/13 |
| 7,062,743 B2 | * | 6/2006 | Kahng et al. .................. | 716/13 |
| 2002/0095643 A1 | * | 7/2002 | Shiratori ......................... | 716/2 |
| 2004/0098690 A1 | * | 5/2004 | Joseph et al. .................. | 716/12 |
| 2004/0117753 A1 | * | 6/2004 | Kahng et al. .................. | 716/12 |
| 2005/0172252 A1 | * | 8/2005 | Cheng et al. .................. | 716/10 |
| 2006/0080630 A1 | * | 4/2006 | Lin ............................... | 716/11 |

* cited by examiner

*Primary Examiner*—Phallaka Kik
(74) *Attorney, Agent, or Firm*—Park, Vaughan & Fleming, LLP; Shun Yao

(57) ABSTRACT

One embodiment of the present invention provides a system that migrates a layout of a cell which is used in integrated circuit design. During operation, the system receives a layout for the cell, wherein one or more layers of the cell contain tracks for metal wires. The system then determines how many tracks are to be inserted into the cell. Next, the system inserts one or more extra tracks between the tracks in the cell. The system subsequently adjusts the widths of the inserted tracks and the original tracks to increase the total number of tracks within the cell while maintaining the metal wires at the center of their original tracks.

30 Claims, 4 Drawing Sheets

METHOD AND APPARATUS FOR INSERTING EXTRA TRACKS DURING LIBRARY ARCHITECTURE MIGRATION

BACKGROUND

1. Field of the Invention

The present invention relates to the process of designing integrated circuits. More specifically, the present invention relates to a method and an apparatus for inserting extra tracks in a library cell to facilitate migration of the cell to a different technology.

2. Related Art

As advances in deep-submicron fabrication technologies make it possible to achieve greater degrees of semiconductor integration, such integration makes the design of integrated-circuits (ICs) increasingly more challenging. By enabling multi-million-gate system-on-chip (SoC) designs, the latest generation of process technologies has widened the gap between manufacturing capabilities and designers' abilities to quickly design these complex devices. Reuse of existing layouts helps close this gap and enables companies to meet tight time-to-market objectives. However, conventional optical shrink techniques no longer work on existing silicon-proven layouts, because at deep-submicron level, different process design rules shrink by different factors.

Fortunately, a new generation of compaction-based electronic design automation (EDA) tools has emerged. These EDA tools can re-size and re-place millions of polygon edges described in an existing layout to conform to particular design rules. Consequently, they can better enable designers to migrate proven layouts to new technologies.

In a layout which is based on a standard library architecture, modern EDA tools are presently able to compact existing library cells to ensure that the target cell layout obtained after migration meets with the latest design rules. However, even with automatic compaction, there are still challenges in migrating certain types of library cells.

One such challenge is to migrate a cell containing tracks for metal wires. A cell typically includes one or more metal layers containing "tracks" where a metal wire can be placed for routing purposes. During migration, a cell ideally follows not only a set of process design rules, but also a set of corresponding template or architectural rules. For example, an existing metal wire ideally remains at the center within a track after additional tracks are added to a cell. Unfortunately, current compaction tools typically cannot guarantee meeting with such architectural rules.

Hence, what is needed is a method and an apparatus for inserting tracks into a library cell during migration of the cell to a different technology without the above-described problems.

SUMMARY

One embodiment of the present invention provides a system that migrates a layout of a cell which is used in integrated circuit design. During operation, the system receives a layout for the cell, wherein one or more layers of the cell contain tracks for metal wires. The system then determines how many tracks are to be inserted into the cell. Next, the system inserts one or more extra tracks between the tracks in the cell. The system subsequently adjusts the widths of the inserted tracks and the original tracks to increase the total number of tracks within the cell while maintaining the metal wires at the center of their original tracks.

In a variation on this embodiment, each metal wire is located at the center of a track.

In a variation on this embodiment, the system sets the widths of the extra tracks to be infinitesimally narrow prior to insertion.

In a variation on this embodiment, the system inserts a metal wire into one of the extra tracks after adjusting the width of that extra track.

In a variation on this embodiment, the system allows a user to specify locations to insert the extra tracks.

In a variation on this embodiment, adjusting the widths of the inserted tracks and the original tracks involves adjusting the widths of the inserted tracks and the original tracks according to a set of process design rules.

In a further variation, adjusting the widths of the inserted tracks and the original tracks according to the set of process design rules involves using a compactor which enforces the set of process design rules.

In a further variation, adjusting the widths of the inserted tracks involves expanding the widths of the inserted tracks to a track width specified by the set of process design rules.

In a further variation, adjusting the widths of the original tracks involves reducing the widths of the original tracks to a track width specified by the set of process design rules.

In a variation on this embodiment, the system scales down the cell layout after adjusting the widths of the inserted tracks and the original tracks based on new process technologies.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Standard Library Cells

Figure 1:
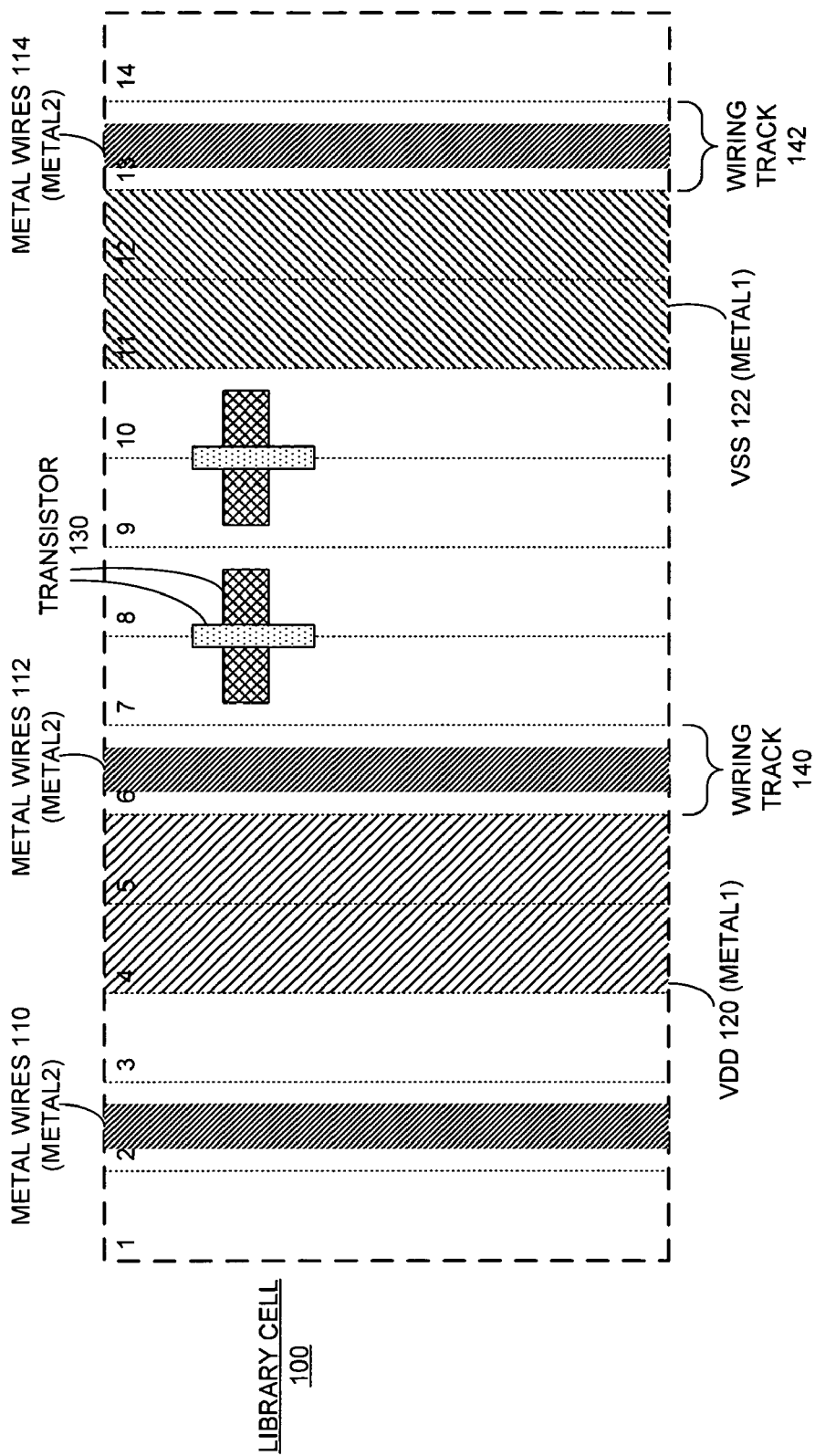
FIG. 1 illustrates an exemplary library cell layout.

FIG. 1 illustrates an exemplary library cell layout. In this example, library cell 100 contains a number of metal wiring tracks, such as tracks 140 and 142. These tracks define the location of metal wires in a metal layer, such as the metal2 layer. As shown in FIG. 1, metal wires 110, 112, and 114 are located with tracks 2, 6, and 13, respectively. Note that a typical architectural rule is that a metal wire has to be fully accommodated within one track and has to be located at the center of that track.

Also shown in FIG. 1 are power rails for high-voltage power supply (VDD 120) and low-voltage power supply (VSS 122). Both of the power-supply rails typically reside in the metal1 layer. In addition, there exist transistors, such as transistor 130, which is located within a cell. Note that the locations of the tracks, metal wires, and transistors are constrained by process design rules.

In the past, layout migration was typically accomplished through a linear shrink process, where every feature of the layout is reduced with respect to scale, size, and spacing by a given factor. While such simple shrink processes have been reasonably successful in migrating to older process technologies, they have become ineffective for new nanometer process technologies.

In a library architecture, because of various physical effects associated with the manufacturing process, each layer and object scales differently, reflecting its specific manufacturing tolerances and sensitivities. In addition, the relationship between polygon size and the characteristics of the underlying elements, such as interconnect characteristics, threshold voltages, and corresponding transistor conductance, are dramatically nonlinear. Therefore, migration needs individual instances to be accurately and individually sized based on specific operating conditions. Particularly, the width and spacing of wires needs to be carefully analyzed, because interconnects significantly impact circuit performance.

Inserting Tracks into an Existing Cell

One challenge in cell-layout migration is to insert additional tracks into a cell when a new process technology allows a narrower track width. However, simply using a compactor with a new set of design rules does not always produce a target layout that meets with the symmetry requirements for some of the metal wires.

Figure 2:
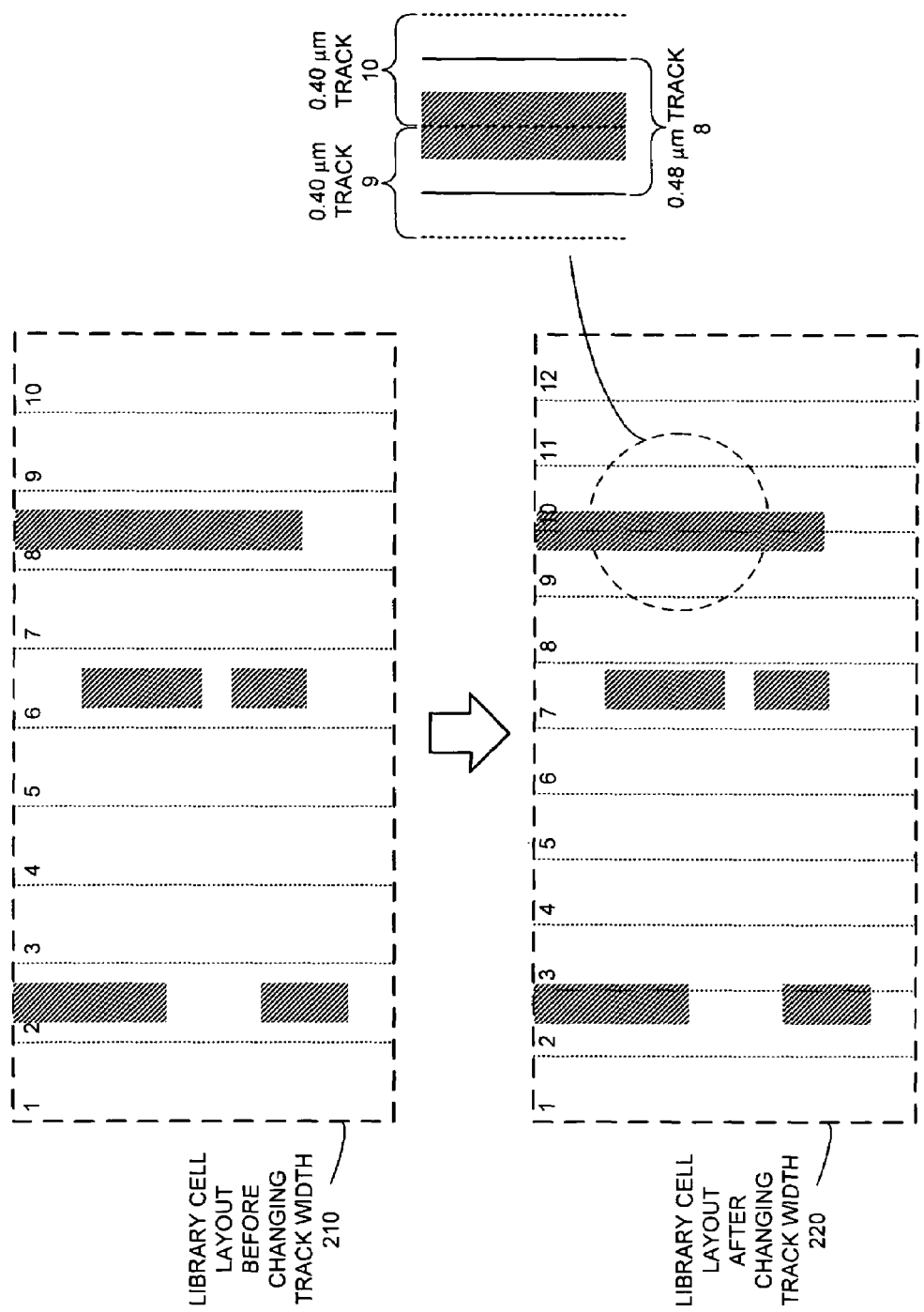
FIG. 2 illustrates the process of linearly dividing a cell to accommodate additional tracks, which results in undesirable shifting of metal wires.

FIG. 2 illustrates the process of linearly dividing a cell to accommodate more tracks which results in undesirable shifting of metal wires. This example demonstrates how mechanically dividing an existing track layout into a larger number of tracks breaks the symmetry of metal wires with respect to their original tracks.

As shown in the top half of FIG. 2, before changing track widths a library cell layout 210 contains 10 tracks, each being 0.48 µm wide. Metal wires are placed within tracks 2, 6, and 8, respectively. Now assume that the new design rules require 12 tracks in a cell. This reduces track width from 0.48 µm to 0.40 µm ((0.48×10)/12=0.40).

The lower part of FIG. 2 illustrates a cell layout 220 after changing the track width. Layout 220 now contains 12 tracks. However, the original metal wire positions have not changed, and hence, they are no longer at the center of their corresponding tracks. For example, the metal wire which is centered within the original 0.48 µm track 8, is now located between the new 0.40 µm tracks 9 and 10. This is undesirable because it violates the symmetry requirement for metal wires.

One goal of the present invention is to migrate a library cell to new design rules while preserving the original topology, and in doing so, to change the architecture of the cell so that the original track information is not lost. To achieve this goal, one embodiment of the present invention uses a "track insertion" technique in combination with the use of a compaction engine. This technique not only creates evenly distributed tracks after insertion, but also retains the topology and symmetry of the original metal wires within their original corresponding tracks.

Figure 3:
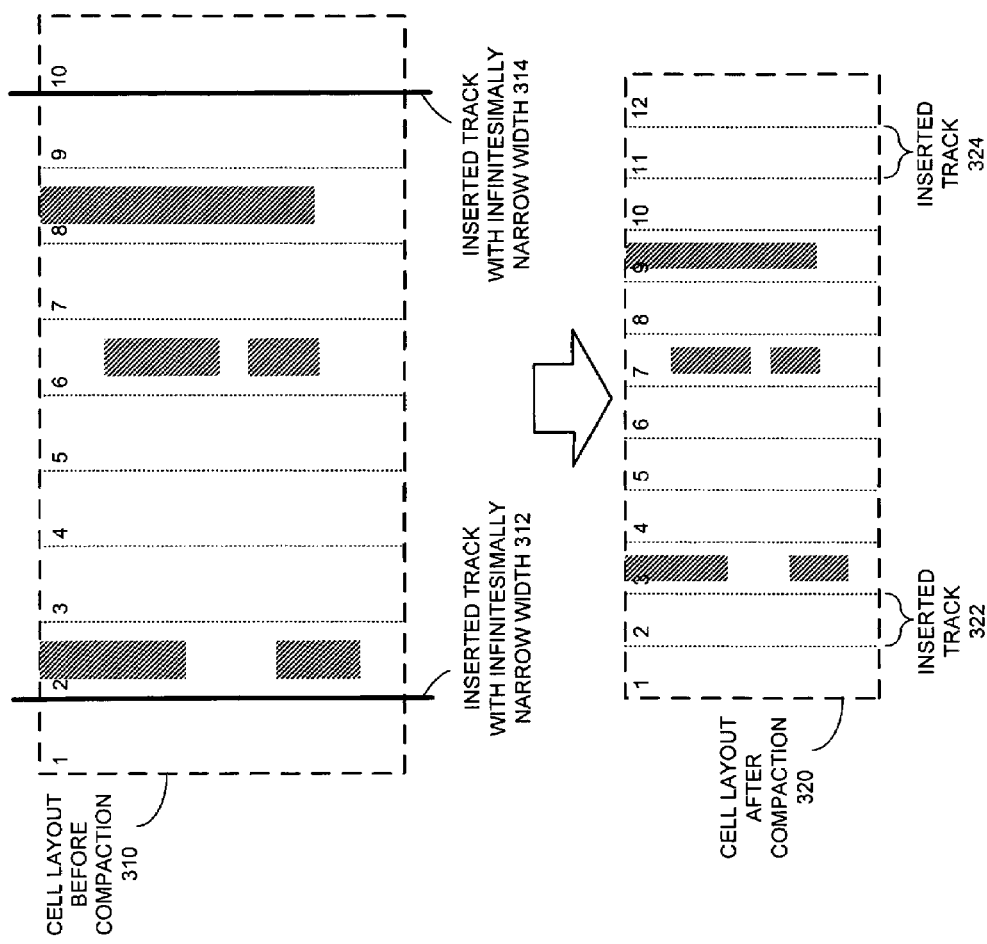
FIG. 3 illustrates the process of adding tracks to a cell by inserting and expanding infinitesimally narrow tracks in accordance with an embodiment of the present invention.

FIG. 3 illustrates the process of adding tracks to a cell by inserting and expanding infinitesimally narrow tracks in accordance with an embodiment of the present invention. As shown in the top half of FIG. 3, cell layout before compaction 310 contains 10 tracks, each being 0.48 µm wide. Tracks 2, 6, and 8 contains metal wires. During operation, the system inserts a number of tracks where additional tracks are needed. In this example, tracks 312 and 314 are inserted between tracks 1 and 2, and tracks 9 and 10, respectively. The width of the inserted tracks are set to be infinitesimally narrow, so that the insertion of these tracks does not change the original track width and the symmetry of metal wires.

Next, the system feeds this layout (with inserted infinitesimally narrow tracks) into a compactor. Assuming that the new design rules correspond to a track width of 0.26 µm, the compactor can automatically expand the width of the inserted track to 0.26 µm, and reduce the width of the original tracks from 0.48 µm to 0.26 µm while maintaining the same topology. Essentially, this insertion technique enables the user to feed a correct topology into a compactor, and allows the compactor to enforce the new design rules while maintaining the input topology.

The output cell layout is shown in the lower half of FIG. 3. The cell layout after compaction 320 now contains 12 tracks, each being 0.26 µm wide. The inserted tracks are tracks 322 and 324. The metal wires remain at the center of their original corresponding tracks.

Note that although FIG. 3 illustrates an example which involves scaling down to a new process technology, the same technique can also be used to modify a cell with the same process technology but with a different number of tracks per cell (i.e., scaling down is not necessary for this technique). The scaling down may occur after modification of the cell layout by a compactor. In addition, the system allows a user to specify preferred locations to insert the infinitesimally narrow tracks, which gives the user more flexibility in cell optimization.

Figure 4:
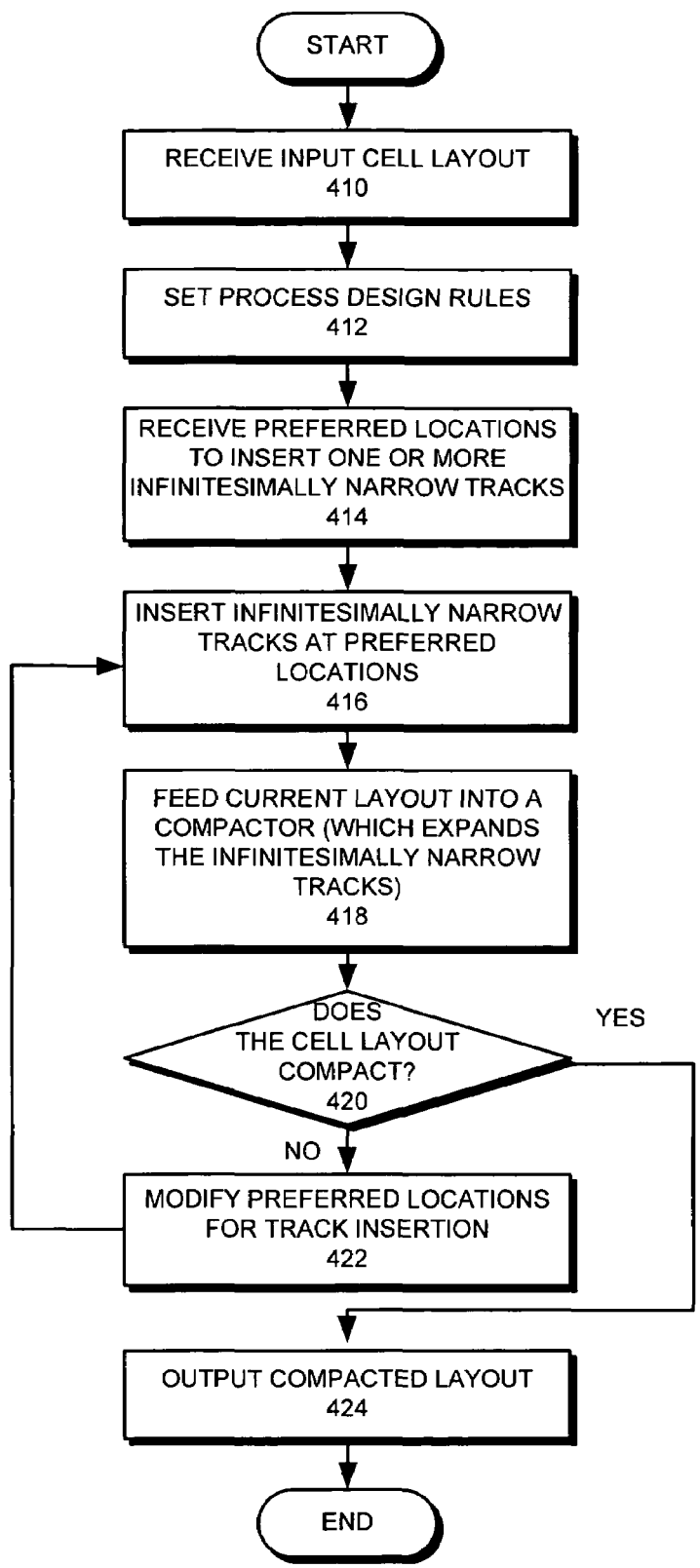
FIG. 4 presents a flow chart illustrating the process of inserting and expanding infinitesimally narrow tracks in accordance with an embodiment of the present invention.

FIG. 4 presents a flow chart illustrating the process of inserting and expanding infinitesimally narrow tracks in accordance with an embodiment of the present invention. During operation, the system starts by receiving an input cell layout (step 410). The system then sets the process design rules (step 412). Next, the system receives the preferred locations to insert one or more infinitesimally narrow tracks from a user (step 414).

After receiving the preferred locations, the system inserts the infinitesimally narrow tracks at these locations (step 416). The system then feeds the layout (with inserted tracks) into a compactor which expands the infinitesimally narrow tracks (step 418). Next, the system determines whether the cell layout compacts according to the process design rules (step 420). If not, the system allows the user to modify the preferred locations (step 422) and re-inserts the tracks into the original cell layout (step 416). If the cell compacts successfully, the system outputs the compacted layout (step 424).

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for migrating a layout of a cell which is used in integrated circuit design, the method comprising:
   receiving a layout for the cell, wherein one or more layers of the cell contain tracks for metal wires;
   determining how many tracks are to be inserted into the cell;
   inserting one or more extra tracks between the tracks in the cell; and
   adjusting widths of the inserted tracks and original tracks to increase a total number of tracks within the cell while maintaining the metal wires at a center of their original tracks.

2. The method of claim 1, wherein each metal wire is located at the center of a track.

3. The method of claim 1, further comprising setting widths of the extra tracks to be infinitesimally narrow prior to insertion.

4. The method of claim 1, further comprising inserting a metal wire into one of the extra tracks after adjusting a width of that extra track.

5. The method of claim 1, further comprising allowing a user to specify locations to insert the extra tracks.

6. The method of claim 1, wherein adjusting the widths of the inserted tracks and the original tracks involves adjusting the widths of the inserted tracks and the original tracks according to a set of process design rules.

7. The method of claim 6, wherein adjusting the widths of the inserted tracks and the original tracks according to the set of process design rules further involves using a compactor which enforces the set of process design rules.

8. The method of claim 6, wherein adjusting the widths of the inserted tracks further involves expanding the widths of the inserted tracks to a track width specified by the set of process design rules.

9. The method of claim 6, wherein adjusting the widths of the original tracks further involves reducing the widths of the original tracks to a track width specified by the set of process design rules.

10. The method of claim 1, further comprising scaling down the cell layout after adjusting the widths of the inserted tracks and the original tracks based on new process technologies.

11. A computer-readable storage medium storing instructions that when executed by a computer cause the computer to perform a method for migrating a layout of a cell which is used in integrated circuit design, the method comprising:
    receiving a layout for the cell, wherein one or more layers of the cell contain tracks for metal wires;
    determining how many tracks are to be inserted into the cell;
    inserting one or more extra tracks between the tracks in the cell; and
    adjusting widths of the inserted tracks and original tracks to increase a total number of tracks within the cell while maintaining the metal wires at a center of their original tracks.

12. The computer-readable storage medium of claim 11, wherein each metal wire is located at the center of a track.

13. The computer-readable storage medium of claim 11, wherein the method further comprises setting a widths of the extra tracks to be infinitesimally narrow prior to insertion.

14. The computer-readable storage medium of claim 1, wherein the method further comprises inserting a metal wire into one of the extra tracks after adjusting a width of that extra track.

15. The computer-readable storage medium of claim 11, wherein the method further comprises allowing a user to specify locations to insert the extra tracks.

16. The computer-readable storage medium of claim 11, wherein adjusting the widths of the inserted tracks and the original tracks involves adjusting the widths of the inserted tracks and the original tracks according to a set of process design rules.

17. The computer-readable storage medium of claim 16, wherein adjusting the widths of the inserted tracks and the original tracks according to the set of process design rules further involves using a compactor which enforces the set of process design rules.

18. The computer-readable storage medium of claim 16, wherein adjusting the widths of the inserted tracks further involves expanding the widths of the inserted tracks to a track width specified by the set of process design rules.

19. The computer-readable storage medium of claim 16, wherein adjusting the widths of the original tracks further involves reducing the widths of the original tracks to a track width specified by the set of process design rules.

20. The computer-readable storage medium of claim 11, wherein the method further comprises scaling down the cell layout after adjusting the widths of the inserted tracks and the original tracks based on new process technologies.

21. An apparatus for migrating a layout of a cell which is used in integrated circuit design, the apparatus comprising:
    a receiving mechanism configured to receive a layout for the cell, wherein one or more layers of the cell contain tracks for metal wires;
    an insertion mechanism configured to determine how many tracks are to be inserted into the cell and to insert one or more extra tracks between the tracks in the cell; and
    an adjustment mechanism configured to adjust widths of the inserted tracks and original tracks to increase a total number of tracks within the cell while maintaining the metal wires at a center of their original tracks.

22. The apparatus of claim 21, wherein each metal wire is located at the center of a track.

23. The apparatus of claim 21, wherein the insertion mechanism is configured to set a widths of the extra tracks to be infinitesimally narrow prior to insertion.

24. The apparatus of claim 21, wherein the insertion mechanism is configured to insert a metal wire into one of the extra tracks after adjusting a width of that extra track.

25. The apparatus of claim 21, wherein the insertion mechanism is configured to allow a user to specify locations to insert the extra tracks.

26. The apparatus of claim 21, wherein while adjusting the widths of the inserted tracks and the original tracks, the adjustment mechanism is configured to adjust the widths of the inserted tracks and the original tracks according to a set of process design rules.

27. The apparatus of claim 26, wherein while adjusting the widths of the inserted tracks and the original tracks according to the set of process design rules, the adjustment mechanism is further configured to use a compactor which enforces the set of process design rules.

28. The apparatus of claim 26, wherein while adjusting the widths of the inserted tracks, the adjustment mechanism is further configured to expand the widths of the inserted tracks to a track width specified by the set of process design rules.

29. The apparatus of claim 26, wherein while adjusting the widths of the original tracks, the adjustment mechanism is further configured to reduce the widths of the original tracks to a track width specified by the set of process design rules.

30. The apparatus of claim 21, further comprising a scaling mechanism configured to scale down the cell layout after adjustment of the widths of the inserted tracks and the original tracks based on new process technologies.

* * * * *

UNITED STATES PATENT AND TRADEMARK OFFICE
CERTIFICATE OF CORRECTION

PATENT NO. : 7,191,425 B1 Page 1 of 1
APPLICATION NO. : 10/993963
DATED : March 13, 2007
INVENTOR(S) : Shobhit Malik It is certified that error appears in the above-identified patent and that said Letters Patent is hereby corrected as shown below:

In claim 13 (at column 6, line 4), please delete the word, "a".

In claim 14 (at column 6, line 6), please delete the number, "1" and replace with the number --11--.

Signed and Sealed this

Fifteenth Day of May, 2007

JON W. DUDAS
*Director of the United States Patent and Trademark Office*